United States Patent [19]
Hendrickson et al.

[11] Patent Number: 5,900,749
[45] Date of Patent: May 4, 1999

[54] THRESHOLD VOLTAGE LEVEL GENERATOR FOR TIME DIVISION DUPLEX COMMUNICATIONS

[75] Inventors: Alan F. Hendrickson; Peter E. Sheldon, both of Austin, Tex.

[73] Assignee: Advanced Micro Devices, Inc., Sunnyvale, Calif.

[21] Appl. No.: 08/856,358

[22] Filed: May 14, 1997

[51] Int. Cl.[6] ............................. H03K 5/00; H03K 25/06; H04L 25/06
[52] U.S. Cl. ................................ 327/96; 327/80; 327/50; 327/552; 327/94; 375/317; 348/465
[58] Field of Search .................................. 327/80, 94, 95, 327/50, 58, 60, 551, 407, 552, 331, 96, 63; 348/465, 622; 375/317, 354

[56] References Cited

U.S. PATENT DOCUMENTS

| | | | |
|---|---|---|---|
| 5,404,172 | 4/1995 | Berman et al. | 348/465 |
| 5,412,692 | 5/1995 | Uchida | 327/58 |

OTHER PUBLICATIONS

OTA Linearization Via Electronically–Programmable Current Mirrors, William J. Adams and Jaime Ramirex–Angulo; pp. 2553–2556.

Regular Brief Papers; A CMOS OTA for HF Filters with Programmable Transfer Function; Eric J. van der Zwan et al.; IEEE Journal of Solids State Circuits, vol. 26, No. 11, Nov. 1991; pp. 1720–1723.

VLSI for Analog/Digital Communications; Miles A. Copeland; May 1991 IEEE Communications Magazine; pp. 25–30.

*Primary Examiner*—Dinh Le

[57] ABSTRACT

A circuit for generating a threshold voltage level from a time division duplex analog data signal. The circuit comprises a sample/hold circuit and an amplifier. The sample/hold circuit is arranged to sample the threshold voltage level during a reception interval and hold the threshold voltage level during a transmission interval. The amplifier includes an operational amplifier coupled to the sample/hold circuit for amplifying the analog data signal during a reception interval and amplifying the threshold voltage level during a transmission interval. A transconductance device is coupled to the operational amplifier, and a plurality of load legs are respectively coupled to a plurality of bias legs. A first selected pair of the respectively coupled load legs and bias legs is coupled to the transconductance device, and a second selected pair of the respectively coupled load legs and bias legs coupled to the output of the amplifier to provide the threshold voltage level.

12 Claims, 2 Drawing Sheets

1

THRESHOLD VOLTAGE LEVEL GENERATOR FOR TIME DIVISION DUPLEX COMMUNICATIONS

BACKGROUND OF THE INVENTION

The invention relates to electronic circuits and, more particularly, to a low-pass filter that can be easily manufactured to precise bandwidth specifications and that has a changeable, programmable bandwidth for use in applications such as a threshold detector for a radio signal data slicer.

Low pass filters are circuits used in many signal processing applications, including many different types of wireless or radio telecommunications. For example, cordless telephones require wireless communications between a first and second unit such as a handset and base. The communications are often in the form of an analog data signal passed back and forth between the two units. Typically, the analog data signal utilizes a single center frequency by allocating alternating time intervals for transmission from each unit. Both units include a receiver circuit and a transmitter circuit for receiving and transmitting the analog data signals, respectively, and the low-pass filter is commonly used in a data slicer of the receiver circuit. In particular, the low-pass filter is used to determine a threshold, or "middle", voltage level of the signal by taking a long term average of the signal. In this way, the data slicer can interpret excursions of the analog data signal below the threshold level as digital "0" symbols, and those above the threshold level as digital "1" symbols. Such operation of a low-pass filter in a data slicer is described in U.S. application Ser. No. 08/864,651 (Attorney Docket No. TT1069, by Alan Hendrickson), entitled "Data Slicer for Demodulated Binary FSK Signals in a Time Division Duplex Radio Environment", which is hereby incorporated by reference.

Referring to FIG. 1, an analog data signal 10, such as may be used in the cordless telephone example described above, has certain inherent characteristics. For one, the analog data signal 10 is separated into discrete time frames, such as time division duplex ("TDD") frames 12 and 14. Each of the frames includes a transmission interval TX, during which the first unit transmits data to the second unit, and a reception interval RX, during which the first unit receives data from the second unit. As seen by a receiver circuit of one of the units (not shown), the analog data signal 10 contains "invalid", or meaningless, data during the transmission intervals TX and may contain "valid" data during the reception intervals RX. Groups of valid data in the analog data signal 10 are referred to as signal components, such as the signal component 16, and signal components are grouped in sequences. A sequence of signal components may start ("initial operation") at the beginning of a reception interval RX (such as the signal component 16 illustrated in FIG. 1), or at a midpoint of the reception interval (not shown).

These characteristics of the analog data signal 10 complicate the determination of the threshold level for the signal. For one, invalid data, such as during the transmission interval TX or during the reception interval RX when no signal component exists, adversely affects the determination of the threshold level. During the transmission interval TX, the analog data signal 10 may be near a zero-level voltage, for power-saving purposes. This zero-level voltage dramatically affects the long term average of the analog signal, and thus the threshold level. In addition, during the reception interval RX when no signal component exists, the analog data signal 10 may drift, thereby adversely affecting the threshold level. Therefore what is need is a low-pass filter that can be responsive to whether or not valid data exists in the analog data signal.

Furthermore, certain signal components of the analog data signal 10 have characteristics that are directly beneficial in determining the threshold level. For example, in normal operation, several signal components are received sequentially. Due to their location in the sequence, certain characteristics of the signal components are known or can be readily determined. For example, the first of a sequence of signal components is always strictly "balanced", i.e., it does not have long series of "1's" or "0's". In addition, other signal components in the sequence are strictly balanced, some are balanced statistically, and some are not balanced at all. Unbalanced signal components are unreliable for the determination of the threshold level, while balanced signal components are particularly advantageous for determination of the threshold level. Therefore, what is need is a low-pass filter that is responsive to the characteristics of the signal components of the analog data signal 10.

Further still, the analog data signal 10 may be distorted due to the operation of the transmitter circuit. Such distortion may be a result of phase lock loop ripple, or other well understood types of demodulator distortion. The analog signal 10, therefore, may contain distortion in the form of a slow varying component, as illustrated by reference arrow 18. Distortion in the analog data signal 10, such as the slow varying component 18, is problematic for determining the threshold level of the analog data signal 10, and therefore what is need is a low-pass filter that is responsive to slow varying components of the analog data signal.

SUMMARY OF THE INVENTION

The foregoing problems are solved and a technical advance is achieved by a method and apparatus for providing a precision, programmable low-pass filter for use in applications such as a threshold detector for a data slicer. In one embodiment, the low-pass filter is combined with a sample/hold circuit, such that the sample/hold circuit only allows a predetermined interval portion of the analog data signal to pass to the low-pass filter. The low-pass filter receives an analog data signal and determines the threshold voltage by rejecting any signal-varying components of the analog data signal, thereby averaging the signal. In addition, the low-pass filter has a time constant that is designed to track any slow varying component in the analog data signal. The low pass filter includes a transconductance amplifier circuit and external passive components.

In another embodiment, the operational amplifier of the low-pass filter has a variable, programmable gain. As a result, the low-pass filter has a variable bandwidth that can be programmed to accommodate different characteristics of signal components in the analog data signal. The filter includes a transconducting device, a first load leg connected between the transconducting device and a first voltage source, and a first bias leg connected between the transconducting device and a second voltage source. To achieve the variable bandwidth, the filter also includes a second load leg coupled to the first load leg and connected between the first voltage source and the output node of the filter and a second bias leg connected between the second voltage source and the output node, such that the second load and bias legs are selectively enabled by a control signal. Therefore, when the second load leg and second bias leg are enabled by the control signal, the filter has a first bandwidth, and when the second load leg and second bias leg are disabled by the control signal, the filter has a second bandwidth.

A technical advantage achieved with the present invention is that the low-pass filter for the threshold detect circuit is programmable and adjusts the threshold level to maintain a reliable midpoint voltage level for the analog data signal. Furthermore, adjustments to the bandwidth of the low-pass filter are made without discontinuities in the output voltage.

Another technical advantage achieved with the present invention is that the low-pass filter for the threshold detect circuit is relatively inexpensive, precise, and simple to manufacture.

DESCRIPTION OF THE PREFERRED EMBODIMENTS

Figure 1:
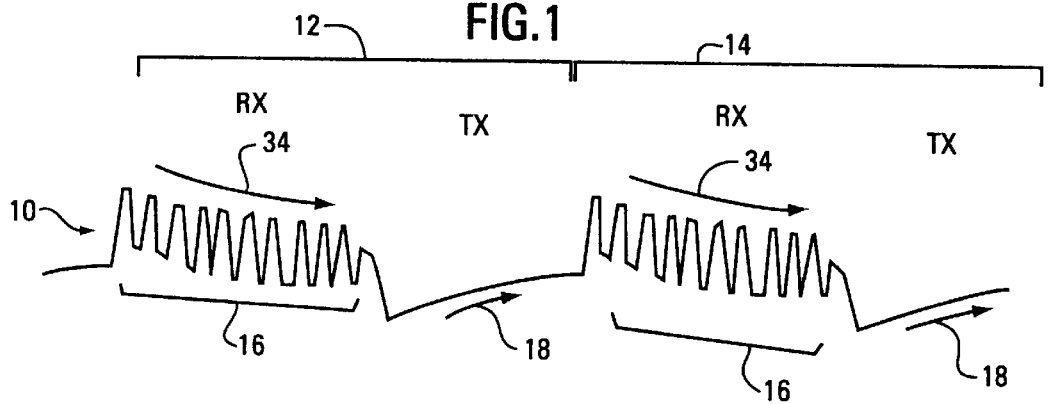
FIG. 1 illustrates a sample waveform of an analog data signal.

As discussed above, FIG. 1 illustrates a sample waveform of an analog data signal.

Figure 2:
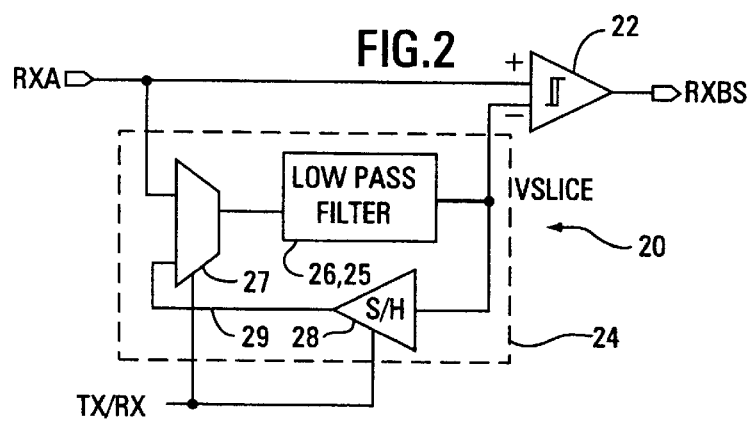
FIG. 2 is a block diagram of a data slicer employing a threshold detector and low-pass filter according to the present invention.

Referring to FIG. 2, the reference numeral 20 designates a data slicer circuit embodying features of the present invention. In the present example, the data slicer 20 is used in a cordless telephone for interpreting an analog data signal RXA that behaves similarly to the analog data signal 10 of FIG. 1. The data slicer 20 receives the analog data signal RXA into a positive terminal of a comparator 22 and into a threshold detector circuit 24. The threshold detector circuit 24 determines a threshold level VSLICE of the analog data signal RXA and provides the threshold level to a negative terminal of the comparator 22. The comparator 22 compares the analog data signal RXA with the threshold level VSLICE to produce a digital data signal RXD.

The threshold detector circuit 24 includes a low-pass filter 26, a 2 to 1 multiplexer ("mux") 27 and a sample/hold circuit 28. During the reception interval RX of the analog data signal RXA, the mux 27 allows the analog data signal to flow directly to the low-pass filter 26. The low-pass filter 26 rejects any signal components in the analog data signal RXA to determine the threshold level VSLICE. In addition, a time constant for the low-pass filter 26 can be designed to track any slow varying components in the analog data signal RXA. The low-pass filter 26 is discussed in greater detail below, with reference to FIGS. 3 and 4.

The sample/hold circuit 28 receives the threshold level VSLICE and a TX/RX signal. The TX/RX signal serves as a control signal so that, during the reception intervals RX, the sample/hold circuit 28 receives the threshold level VSLICE, and during the transmission intervals TX, the sample/hold circuit holds the threshold level, thereby ignoring any changes in the threshold level during the transmission interval. Although not shown, there are many possible implementations of the sample/hold circuit 28, such as a latch, that are readily apparent to those skilled in the art.

An output 29 of the sample hold is provided to the mux 27. In this way, the mux 27 can selectively route, in response to the TX/RX signal, either the analog data signal RXA or the threshold level VSLICE to the low-pass filter 26. As discussed above, during the reception interval, the analog data signal RXA is passed to the low-pass filter 26. During the transmission interval TX, the threshold level VSLICE is passed to the low-pass filter 26. As a result, the low-pass filter is not adversely affected by invalid data during the transmission interval TX.

Figure 3:
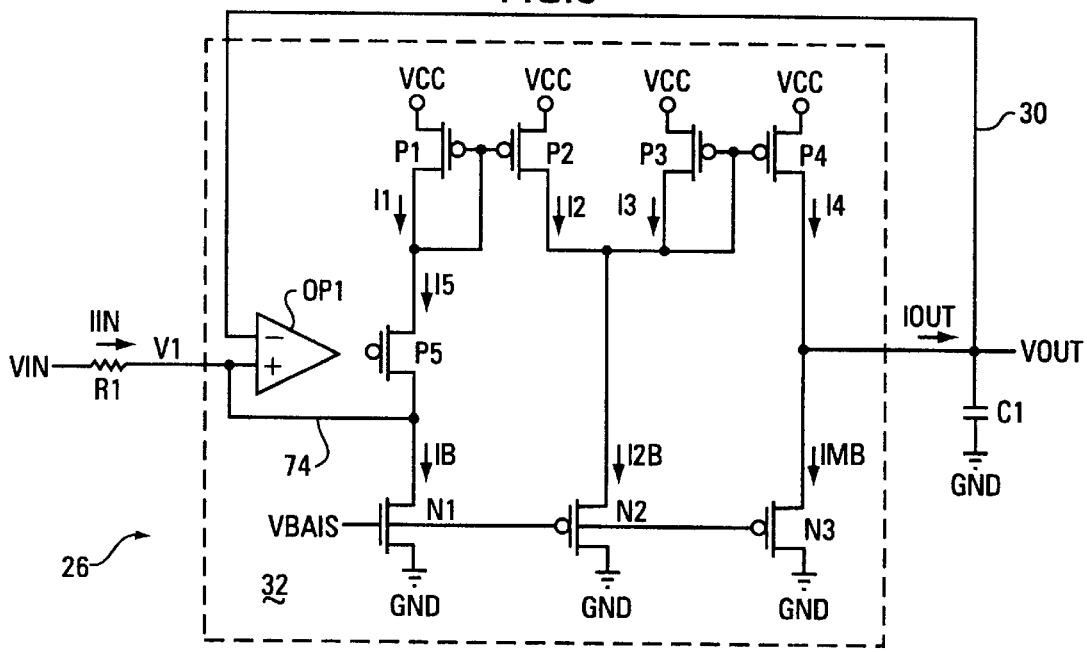
FIG. 3 is a schematic diagram of a low-pass filter utilizing a first embodiment of an amplifier for the low-pass filter.

Referring to FIG. 3, a first embodiment of the low-pass filter 26 includes an input resistor R1, an output capacitor C1, a feedback loop 30 and an amplifier 32. The amplifier 32 utilizes a positive source voltage VCC and a negative, ground voltage GND. The amplifier 32 includes an operational amplifier (op amp) OP1, five p-type field effect transistors (FETs) P1, P2, P3, P4, P5, three n-type FETs N1, N2, N3, and a bias signal VBIAS. The p-type FET P5 serves as a transconductance device to provide a voltage to current translation from the op amp OP1 to the FETs P1, N1. The op amp OP1 receives a voltage V1 into the positive terminal and the feedback loop 30 into the negative terminal to drive the gate of FET P5. The drain of FET P5 is included in a feedback loop 34 to the op amp OP1 so that the transconductance gain, which may vary significantly from amplifier to amplifier, is compensated by the op amp. The source of FET P5 is connected to the drain of FET P1 and couples the FET P1 to the FET P2 by commonly connecting their gates together. The sources of FETs P1, P2, P3, and P4 are connected to the positive source voltage VCC. The drains of FETs P2 and P3 are commonly connected to the gates of FETs P3 and P4, thereby coupling FET P3 to FET P4. The drain of FETP4 is connected to an output voltage VOUT. The three n-type FETs N1, N2, N3 have their drains connected to the drains of FETs P1, P2 and P4, respectively, their sources commonly connected to the ground voltage GND, and their gates commonly connected to the bias signal VBIAS.

The p-type FETs P1, P2, P3, P4, serve as "load legs" of the amplifier 32 and have gates of predetermined sizes. In addition, the n-type FETs N1, N2, N3 serve as "bias legs" of the amplifier 32 and also have gates of predetermined sizes. Although the actual sizes of the FETs P1–P4, N1–N3 are determined by other factors outside of the scope of this patent, a sizing ratio, or mirroring ratio as compared with each other, is important. The mirroring ratios are shown in Table 1, below, where "M" represents a discrete mirroring ratio that may be customized to specific applications, as discussed in greater detail below. In addition, source-drain currents for the p-type FETs P1–P5 and drain-source currents for the n-type FETs N1–N3 are also labeled in Table 1.

TABLE 1

| FET | Mirroring Ratio | Current |
|---|---|---|
| P1 | 1 | I1 |
| P2 | 1 | I2 |
| P3 | 1 | I3 |
| P4 | M | I4 |
| P5 | 1 | I5 |
| N1 | 1 | IB |
| N2 | 2 | 2 * IB |
| N3 | M | M * IB |

The low-pass filter 26 receives an input voltage VIN and an input current IIN that represent the analog data signal RXA. The low-pass filter 26 drives the output voltage VOUT and an output current IOUT that represent the threshold voltage VSLICE. Operation of the low-pass filter 26 can be understood by examining the currents I1, I2, I3, I4, I5, IB, IIN and IOUT as follows:

a) I1=I5;
b) IB=I5+IIN;
c) I2=I1;
d) I3=(2×IB)−I2;
e) I4=M×I3; and
f) IOUT=I4−(M×IB)=M×((2×IB)−I2−IB) =M×IIN.

A transfer function VOUT/VIN, for the low-pass filter 26 is defined as follows:

g) VIN−(IIN×R1)=VOUT, due to a high open loop gain for op amp OP1;
h) VOUT=IOUT/(S×C), where 1/(S×C) is the impedance of capacitor C1;
i) VOUT=M×IIN/(S×C), from equation f), above;
j) IIN=VOUT×S×C/M;
h) VIN−VOUT×S×C×R/M=VOUT
i) VOUT×(1+R1×S×C/M)=VIN; and
j) 
$$VOUT/VIN = 1/(1+R1 \times S \times C/M)$$
$$= (M/R1 \times C) \times (1/(S+M/R1 \times C))$$
$$= M \times (1/(S \times C))/(R1+M \times (1/(S \times C))).$$

Provided that the resistor R1 has an impedance Z1 and the capacitor C1 has an impedance Z2, the transfer function can be described as:

k) VOUT/VIN=M×Z2/(Z1+(M×Z2)).

As a result of the transfer function, the low-pass filter 26 has a cut-off frequency that is determined by the mirror ratio M. Due to modern, highly advanced silicon fabrication techniques, the mirroring ratio for each of the FETs, including the ratio M, can thereby be precisely determined and controlled. Therefore, the low-pass filter 26 can be manufactured very precisely.

The above described first embodiment of the low-pass filter 26 illustrates some of the fundamental concepts of the invention. A second embodiment of the low-pass filter, hereinafter designated by reference numeral 26', is preferred to the first embodiment 26.

Figure 4:
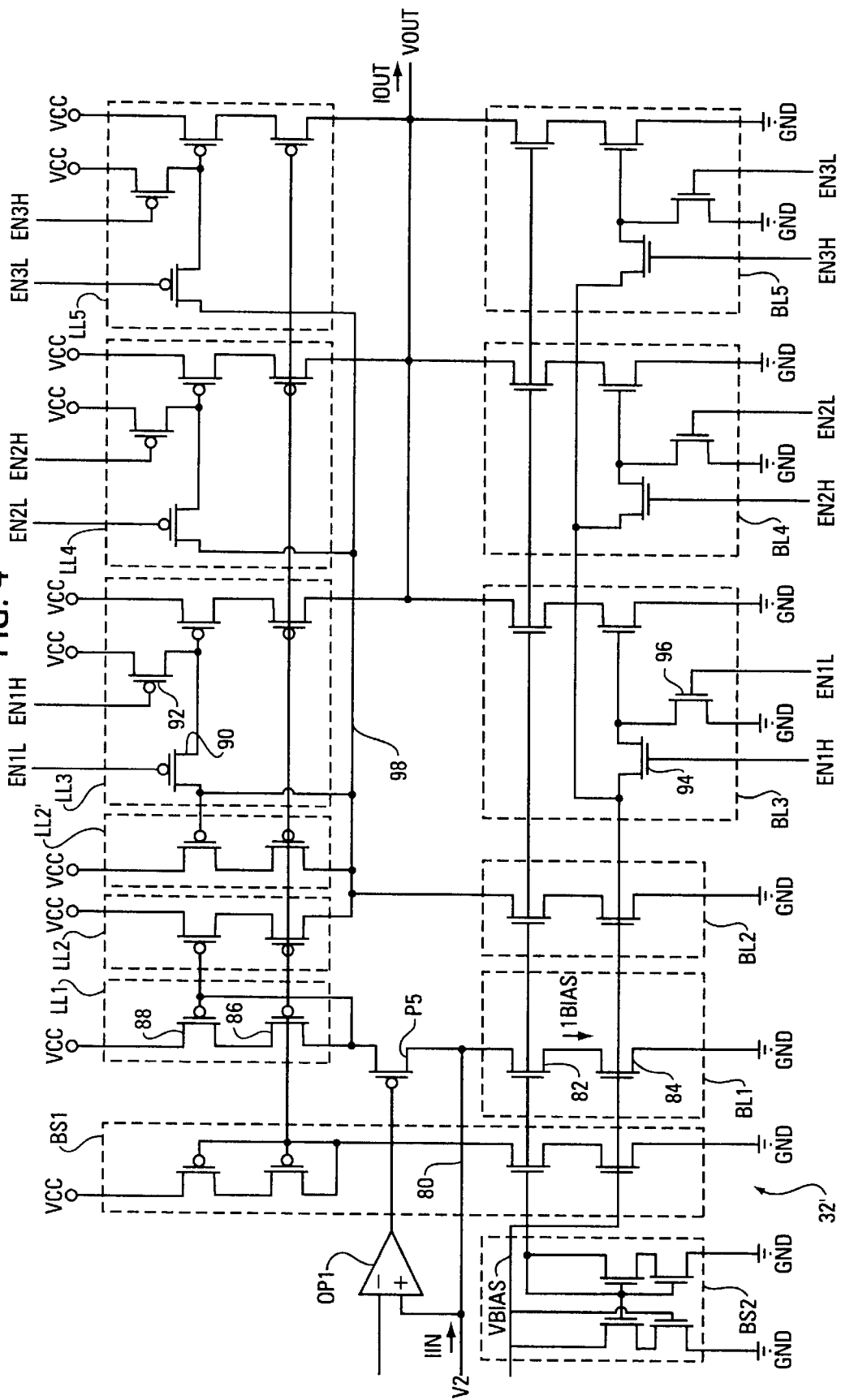
FIG. 4 is a schematic diagram of a second, preferred embodiment of the amplifier to be used with the low-pass filter of FIG. 3.

Referring to FIG. 4, the second embodiment of the low-pass filter 26' utilizes an improved amplifier, designated by the reference numeral 32', and a plurality of control signals EN1H/L, EN2H/L, EN3H/L for adjusting and programming the gain of the amplifier, and hence the bandwidth of the low-pass filter. Several circuits, voltages and symbols utilized in the previous amplifier 32 are similarly used in the improved amplifier 32', including the op amp OP1, the p-type FET P5, the bias signal VBIAS, the positive supply voltage VCC, the ground voltage GND, the input and output voltages V1, VOUT, respectively, and the input and output currents IIN, IOUT, respectively. The amplifier 32' further includes five load legs LL1, LL2, LL2', LL3, LL4, four bias legs BL1, BL2, BL3, BL4, and two bias support networks BS1, BS2.

The FET P5 is a transconductance device, as described above with respect to FIG. 3. The FET P5 has a wide gate size so that the saturation voltage is very low, thereby accommodating a large common mode voltage swing. The drain of FET P5 is included in a feedback loop 80 to the positive input terminal of the op amp OP1 so that the gain of the op amp, which may vary significantly, is thereby compensated. For the remaining description, each well of each p-type FET is tied to VCC and each well of each n-type FET is tied to GND.

The bias leg BL1 is a cascode arrangement of n-type FETs 82, 84, thereby presenting to the transconducting FET P5 an extremely high impedance. Furthermore, the first bias leg BL1 sinks a relatively constant bias current IBIAS of about 10 micro Amps (uA). As a result, the bias leg BL1 assures that the current drawn through the first load leg LL1 is approximately the difference between the bias current IBIAS and the input current IIN. The first bias leg BL1 is supported by the bias signal VBIAS, which is connected to the gate of FET 84, and the bias support network BS2 which is connected to the gate of FET 82. The FETs 82, 84 have very low saturation voltages and therefore the bias support network BS2 and bias signal VBIAS may provide bias voltages allowing the bias current IBIAS to remain constant over a large range of output voltages. The bias legs BL2, BL3, BL4, BL5 each similarly contain a cascode arrangement of n-type FETs, and are similarly supported by the bias signal VBIAS and the bias support network BS2.

The first load leg LL1 is a cascode arrangement of p-type FETs 86, 88, thereby presenting to the transconducting FET P5 an extremely high impedance. The first load leg LL1 is supported by the bias support network BS1. The FETs 86, 88 have very low saturation voltages and therefore the bias support network BS1, which is connected to the gate of FET 86, provides bias voltages allowing a large voltage swing on the cascoded p-type FETs 86, 88. The load legs LL2, LL2', LL3, LL4, LL5 each similarly contain a cascode arrangement of p-type FETs, and are similarly supported by the bias support network BS1.

The second load leg LL2 is identical to the first load leg LL1, except that the effective channel width of the cascoded p-type FETs is doubled by using a parallel-device-leg technique well known by those of ordinary skill in complementary metal oxide semiconductor (CMOS) circuit design art. The current in the second load leg LL2 then mirrors the current in the first load leg LL1 with a mirror ratio, or multiplying factor, of two. The high impedance presented by the cascoded p-type FETs assures highly accurate current mirroring and the bias support network BS1 allows adequate voltage swing. The second load leg LL2 is also coupled to the first load leg LL1 by having the gate for one of the cascoded p-type FETs of the second load leg LL2 connected to the gate of FET 88.

The second bias leg BL2 is identical to the first bias leg BL1 except that the effective channel width of the second bias leg is increased by a factor of four. The current in the second bias leg BL2 then mirrors that of the first bias leg BL1, with a multiplying factor of four. The high impedance presented by the cascode configuration of the FETs of bias leg BL2 assures highly accurate current mirroring and the bias support network BS2 allows a wide voltage range.

The cascoded p-type FETs in the load leg LL2' remain in saturation mode, and therefore the current flowing through them is equal to the difference between the current drawn by the second bias leg BL2 and the current drawn by the second load leg LL2. The cascoded p-type FETs in the load leg LL2' are matched to the FETs of the second load leg LL2. As a result, the load leg LL2' inverts the arithmetic sign of the modulated current of the second load leg LL2, which is necessary to obtain the desired transfer function of the low-pass filter 26'. The load legs LL2, LL2' are commonly connected to the bias leg BS2.

The third load leg LL3 includes two additional p-type FETs 90, 92 in order to allow the control signals EN1L and EN1H, which are logically complementary signals and are attached to the gates of the FETs 90, 92, respectively, to enable or disable the load leg. When EN1H is high and EN1L is low, the cascoded FETs of the third load leg LL3 are coupled to those of the load leg LL2' through a conductor 98, and the current in the third load leg mirrors the current in the load leg LL2'. When EN1H is low and EN1L is high, the cascoded FETs of the third load leg LL3 are decoupled from the load leg LL2' and pulled high, effectively turning off any current flowing therethrough. Therefore, when third load leg LL3 is enabled, it is coupled to the load leg LL2' so that the current flowing through the third load leg matches the current through the load leg LL2'. Furthermore, the cascoded configurations and identical biasing by the bias support network BS1 for the load legs LL2' and LL3 assure that the current in each load leg is accurately mirrored over a wide voltage range.

The third bias leg BL3 includes two additional n-type FETs 94, 96 to enable or disable the bias leg under control of the control signals EN1H and EN1L. When EN1H is high and EN1L is low, the cascoded FETs of the third bias leg BL3 are coupled to those of the second bias leg BL3 through the bias support network BS3. When EN1H is low and EN1L is high, the cascoded FETs of the third bias leg BL3 are decoupled from the bias support network BS3 and the bias leg BL2 and pulled low, effectively turning off any current flowing therethrough. Therefore, when the third bias leg BL3 is enabled, the current flowing through it mirrors the bias current IBIAS flowing through the first bias leg BL1 by a factor of two, and when disabled, the third bias leg allows no current to flow therethrough. Therefore, when third bias leg BL3 is enabled, it is designed to match the first load leg LL1 with a multiplying factor of two.

The combination of the third load leg LL3 and the third bias leg BL3 contribute a net current to the output current IOUT equal to about two times the input current IIN. Furthermore, the current contribution to IOUT by legs LL3 and BL3 may be either positive or negative, depending on the size of the third load leg current. The contribution may also be zero if the legs LL3 and BL3 are disabled by the control signals EN1H and EN1L. Finally, the legs LL3 and BL3 are designed as cascoded outputs to present a very high output impedance to a load driven by the output current IOUT. The high output impedance is necessary to assure that the output current IOUT remains constant over a wide voltage range of loads, including extremely high impedance loads.

The fourth load leg LL4 and the fourth bias leg BL4 form an output pair identical to the pair formed by the third load leg LL3 and the third bias leg BL3, except that they are controlled by the complementary control signals EN2H and EN2L. As a result, the control signals EN2H, EN2L selectively couple the fourth load leg LL4 to the load leg LL2' by the conductor 98.

The fifth load leg LL5 and the fifth bias leg BL5 form an output pair identical to the pair formed by the third load leg LL3 and the third bias leg BL3, except that they are controlled by the complementary control signals EN3H and EN3L and that the device widths are increased by a factor of eight. When the legs LL5 and BL5 are enabled, the fifth load leg LL5 is coupled to the load leg LL2' by the conductor 98, and the resultant contribution to the output current IOUT provided by the load leg LL5 is eight times that of the current contribution provided by the legs LL3 and BL3.

The current contribution resulting from all the load LL1–LL5 and bias legs BL1–BL5 can now be calculated as a multiple of the input current IIN, where the value of the mirror ratio M is determined by the control signals EN1H, EN2H, EN3H and their logical complements. The transfer function of the second embodiment low-pass filter 26' is the same as that for the first embodiment low-pass filter 26, as shown in Equation k), above. Therefore, the bandwidth for the filter varies directly with the mirror ratio M. With the improved amplifier 32', the low-pass filter 26' has potential mirror ratios M as listed in Table 3.

TABLE 3

| EN3H | EN2H | EN1H | Mirroring Ratio M |
|------|------|------|-------------------|
| 0 | 0 | 0 | 0 |
| 0 | 0 | 1 | 2 |
| 0 | 1 | 0 | 2 |
| 0 | 1 | 1 | 4 |
| 1 | 0 | 0 | 16 |
| 1 | 0 | 1 | 18 |
| 1 | 1 | 0 | 18 |
| 1 | 1 | 1 | 20 |

It is clear from the foregoing discussion that the improved amplifier 32' allows precise control over the bandwidth of the low-pass filter 26', which is a factor M multiplied by the intrinsic, or absolute, filter bandwidth determined by the external components R1 and C1 (FIG. 3). The amplifier 32' further provides precision timing control for dynamically changing the bandwidth of the filter 26' through the control signals EN1H/L, EN2H/L, EN3H/L. Furthermore, changes in the bandwidth produce no undesirable step responses in the output voltage VOUT across the load capacitor C1 because modifications of the bandwidth entail only the initiation or cessation of current contributions to the load capacitor.

In addition to its other advantages, the improved amplifier 32' is designed for minimal pin requirements and low power consumption. It requires only three pins for connectivity. Bias currents through each of the bias legs BS1–BS5 are small, on the order of 20 to 40 uA, and the power consumption in any disabled load and bias legs is negligible.

In the preferred embodiment, the control signals may be used to modify the bandwidth during different characteristics of signal components in the analog data signal RXA (FIG. 2) as shown in Table 4. It should be clear from the example that the resolution and magnitude of the mirror ratio M is limited only by the constraints of the application. It is also understood that the size and quantity of output load and bias leg combinations can be manipulated to achieve a wide range of mirror ratio values, both greater than and less than unity, both integer and non-integer.

TABLE 4

| Condition | Mirror ratio M | EN3H | EN2H | EN1H |
|-----------|----------------|------|------|------|
| transmission interval TX | 0 | 0 | 0 | 0 |
| unbalanced data | 0 | 0 | 0 | 0 |
| statistically balanced data | 2 | 0 | 0 | 1 |
| strictly balanced data | 4 | 0 | 1 | 1 |
| initial operation | 20 | 1 | 1 | 1 |

Furthermore, it is understood that the present invention is not limited to cordless telephones, but may be used with many other different types of electronic circuits. Therefore, although certain illustrative embodiments of the invention have been shown and described, a wide range of modification, change, and substitution is contemplated in the foregoing disclosure and, in some instances, some features of the present invention may be employed without a corresponding use of other features. Accordingly, it is appropriate that the foregoing description be construed broadly and understood as being given by way of illustration and example only, the spirit and scope of the invention being limited only by the appended claims and structural equivalents thereof.

What is claimed is:

1. A circuit for generating a threshold voltage level from a time division duplex analog data signal, the signal having a transmission interval and a reception interval, the circuit comprising:

a multiplexer having a first input for receiving the data signal, a second input, an output and a selector for selecting the first input during the reception interval and the second input during the transmission interval;

a sample/hold circuit having an output coupled to the second input of the multiplexer to provide the threshold voltage and an input for receiving and sampling the threshold voltage level during the reception interval and holding the threshold voltage level during the transmission interval; and an amplifier having an input coupled to the output of the multiplexer and an output coupled to the input of the sample/hold circuit and comprising an operational amplifier having an output, a transconductance device coupled to the output of the operation amplifier, and a plurality of load legs respectively coupled to a plurality of bias legs, wherein the transconductance device is coupled between a first pair of the respectively coupled load legs and bias legs, and a last pair of the respectively coupled load legs and bias legs provides the threshold voltage level at the output of the amplifier.

2. A circuit according to claim 1 further comprising a resistor coupled to the input of the amplifier and a capacitor coupled to the output of the amplifier for defining an absolute bandwidth.

3. A circuit according to claim 2, wherein the bias legs are comprised of n-type FETs and the load legs are comprised of p-type FETs, and the transistors of each of the load legs and respectively coupled bias legs have predetermined size ratios to establish a predetermined cut-off frequency.

4. A circuit according to claim 3 wherein at least one of the load legs includes a first switch and at least one of the bias legs includes a second switch, wherein each of the first and second switches are arranged to receive respective control signals to selectively enable the one of the load legs and the one of the bias legs, thereby allowing a bandwidth of the circuit to be selectively altered.

5. A circuit for generating a threshold voltage level from an analog data signal, the threshold voltage level for discerning between digital data values represented by the analog data signal, the circuit controlled by a transmit-receive control signal that indicates transmission and reception intervals and comprising:

a multiplexer having first and second input ports, an output port, and a selector port, the multiplexer arranged to receive the analog data signal on the first input and receive the transmit-receive control signal on the selector port;

an operational amplifier having first and second input ports and an output port, wherein the output port of the multiplexer is coupled to one of the input ports;

a plurality of load legs each coupled one to another;

a plurality of bias legs each coupled one to another, and each coupled to a respective one of the load legs, wherein a last load leg and a last bias leg provide the threshold voltage level at a common node;

a transconductance device coupled to the output port of the operational amplifier and between a first load leg and a first bias leg, whereby a voltage to current translation of the amplifier analog data signal is provided to the first load leg and the first bias leg by the transconductance device; and a sample/hold circuit having an input coupled to the common node and an output coupled to the second input of the multiplexer, the sample/hold circuit sampling the threshold voltage during the reception intervals and hold the threshold voltage during the transmission intervals responsive to the transmit-control signal.

6. The circuit of claim 5, wherein the operational amplifier has a positive and negative input ports, the output of the multiplexer being coupled to the positive input port and the negative input port is coupled to receive the threshold voltage level.

7. The circuit of claim 6 wherein the transconductance device has a drain that is coupled to the positive input port of the operational amplifier.

8. The circuit of claim 5, wherein one of the load legs includes a p-type FET and one of the bias legs includes an n-type FET, wherein the drain of the p-type FET is coupled to the transconductance device, and the source of the n-type FET is coupled to the transconductance device.

9. The circuit of claim 8, wherein the transconductance device is a p-type FET having a gate coupled to the output port of the operational amplifier.

10. The circuit of claim 5, wherein the bias legs are comprised of cascode arrangements of n-type FETs and the load legs comprised of cascode arrangements of p-type FETs.

11. The circuit of claim 10, further comprising:

a capacitor coupled to the common node; and wherein the transistors of the load legs and respectively coupled bias legs have predetermined size ratios to establish a predetermined cut-off frequency.

12. The circuit of claim 10, wherein at least one of the load legs includes a first control transistor, and at least one of the bias legs includes a second control transistor, wherein the first and second control transistors are arranged to receive respective control signals to selectively enable the one of the load legs and the one of the bias legs.

* * * * *

UNITED STATES PATENT AND TRADEMARK OFFICE
CERTIFICATE OF CORRECTION

PATENT NO.   : 5,900,749
DATED        : May 4, 1999
INVENTOR(S)  : Hendrickson et al.

It is certified that error appears in the above-identified patent and that said Letters Patent is hereby corrected as shown below:

Column 9,
Line 20, "operation" should read -- operational --.

Signed and Sealed this

Twenty-first Day of May, 2002

Attest:

JAMES E. ROGAN
Attesting Officer            Director of the United States Patent and Trademark Office